United States Patent
Lee et al.

(10) Patent No.: US 12,324,317 B2
(45) Date of Patent: Jun. 3, 2025

(54) ORGANIC LIGHT-EMITTING DIODE DISPLAYS WITH CAPILLARY-FLOW-INDUCING STRUCTURES

(71) Applicant: Apple Inc., Cupertino, CA (US)

(72) Inventors: Kuan-Yi Lee, New Taipei (TW); Takahide Ishii, Taoyuan (TW); Prashant Mandlik, Sunnyvale, CA (US); Chih-Lei Chen, TaiChung (TW); Bhadrinarayana Lalgudi Visweswaran, San Mateo, CA (US); Ankit Mahajan, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 417 days.

(21) Appl. No.: 17/826,416

(22) Filed: May 27, 2022

(65) Prior Publication Data

US 2023/0080552 A1     Mar. 16, 2023

Related U.S. Application Data

(60) Provisional application No. 63/243,649, filed on Sep. 13, 2021.

(51) Int. Cl.
*H10K 59/122*     (2023.01)
*H10K 50/844*     (2023.01)

(52) U.S. Cl.
CPC ......... *H10K 59/122* (2023.02); *H10K 50/844* (2023.02)

(58) Field of Classification Search
CPC .................................................. H10K 59/122
See application file for complete search history.

(56) References Cited

U.S. PATENT DOCUMENTS

| | | | |
|---|---|---|---|
| 10,374,072 B2 | 8/2019 | Nuzzo et al. | |
| 10,727,434 B2 | 7/2020 | Kwon et al. | |
| 10,756,292 B2 | 8/2020 | Tang et al. | |
| 11,139,450 B2 | 10/2021 | Cheng | |
| 2018/0331320 A1 | 11/2018 | Su et al. | |
| 2019/0027705 A1 | 1/2019 | Chen et al. | |
| 2019/0214443 A1 | 7/2019 | Liu et al. | |
| 2023/0263034 A1* | 8/2023 | Kim | H10K 59/122 257/91 |

\* cited by examiner

*Primary Examiner* — Yu-Hsi D Sun
(74) *Attorney, Agent, or Firm* — Treyz Law Group, P.C.; Joseph F. Guihan; Jinie M. Guihan

(57) ABSTRACT

An organic light-emitting diode (OLED) display may have an array of pixels that each have OLED layers interposed between a cathode and an anode. The display may also include a planarization layer that is deposited using inkjet printing. To mitigate the need for dam structures to prevent overflow of the planarization layer during inkjet printing, capillary-flow-inducing structures may be included in the inactive area of the display. The topology of the capillary-flow-inducing structures may be propagated to a passivation layer such that an upper surface of the passivation layer has a similar topology as the capillary-flow-inducing structures. The planarization layer therefore undergoes capillary flow when deposited on the upper surface of the passivation layer. The capillary-flow-inducing structures may be formed from dots, rectangular strips, or trapezoidal strips. The capillary-flow-inducing structures may be formed from the same material as spacers in the active area or using another layer in the display.

15 Claims, 16 Drawing Sheets

ORGANIC LIGHT-EMITTING DIODE DISPLAYS WITH CAPILLARY-FLOW-INDUCING STRUCTURES

This application claims priority to U.S. provisional patent application No. 63/243,649, filed Sep. 13, 2021, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

One or more passivation layers and planarization layers may be included in the display to protect the OLED layers in the display from moisture. However, the passivation layers and/or planarization layers may occupy more space within the electronic device than is desired.

It would therefore be desirable to be able to provide improved displays for electronic devices.

SUMMARY

An electronic device may have a display such as an organic light-emitting diode display. The organic light-emitting diode (OLED) display may have an array of organic light-emitting diode pixels that each have OLED layers interposed between a cathode and an anode. A capping layer, a first passivation layer, a planarization layer, and a second passivation layer may be formed over the cathode. The planarization layer may be deposited using inkjet printing.

To mitigate the need for dam structures to prevent overflow of the planarization layer during inkjet printing, capillary-flow-inducing structures may be included in the inactive area of the display. The capillary-flow-inducing structures may be formed below the first passivation layer and the planarization layer. The topology of the capillary-flow-inducing structures may be propagated to the first passivation layer such that an upper surface of the first passivation layer has a similar topology as the capillary-flow-inducing structures. The planarization layer therefore undergoes capillary flow when deposited on the upper surface of the passivation layer.

The capillary-flow-inducing structures may be formed from dots, rectangular strips, or trapezoidal strips. The capillary-flow-inducing structures may help form a desired corner shape for the planarization layer (e.g., a rounded corner or right-angled corner). The capillary-flow-inducing structures may be formed from the same material as spacers in the active area of the display or using another layer in the display.

DETAILED DESCRIPTION

Figure 1:
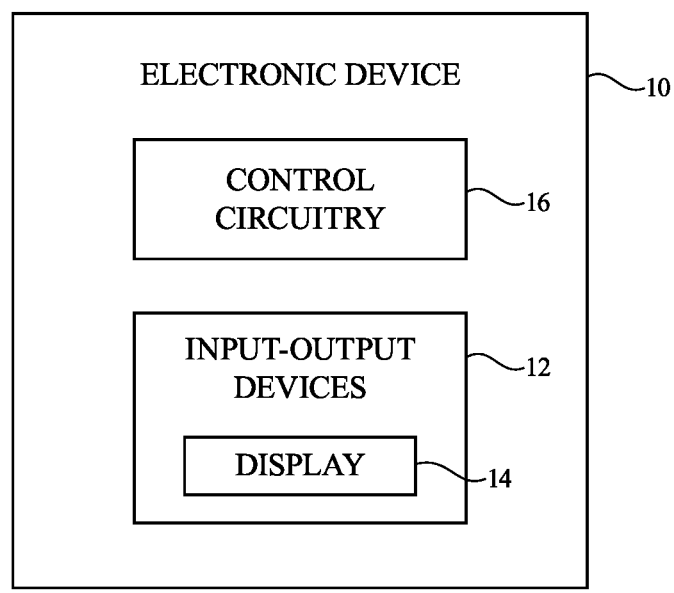
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
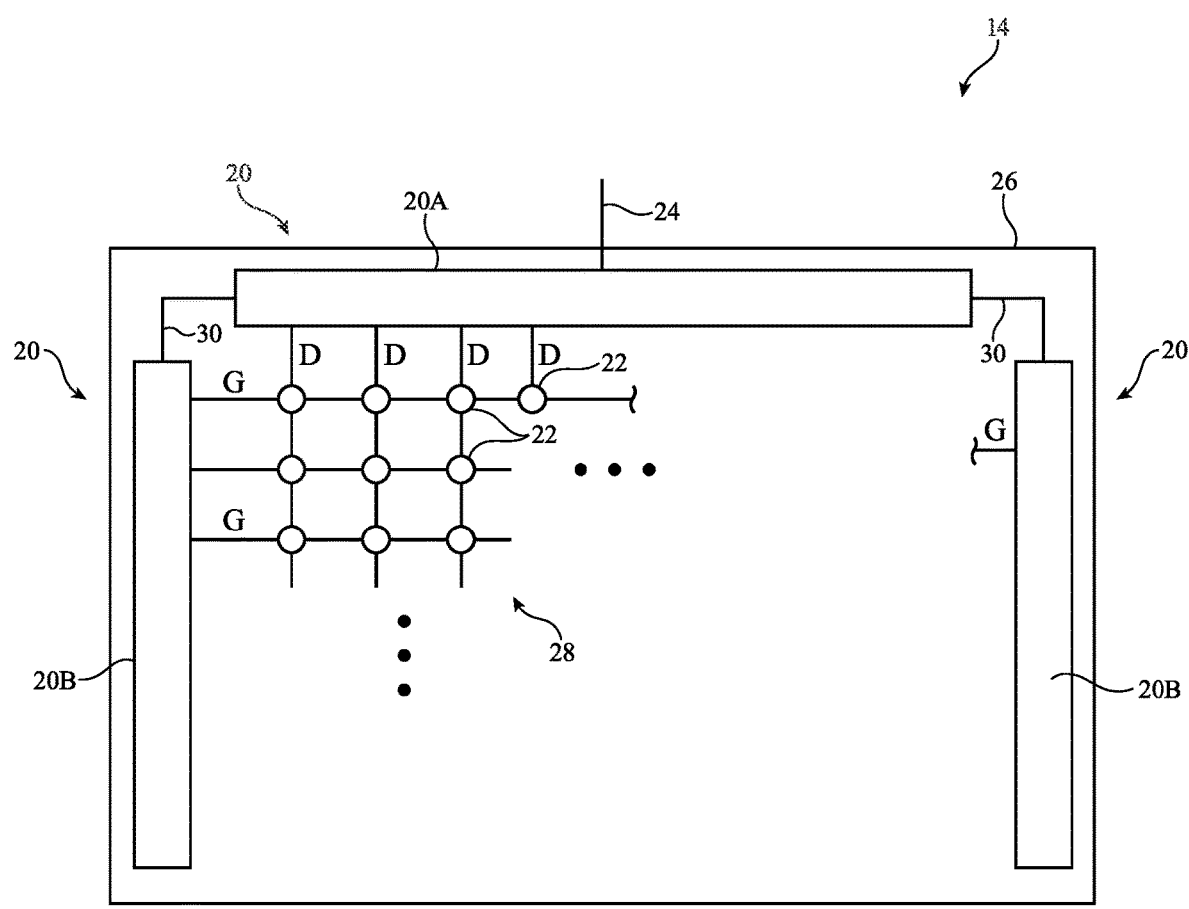
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 22. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
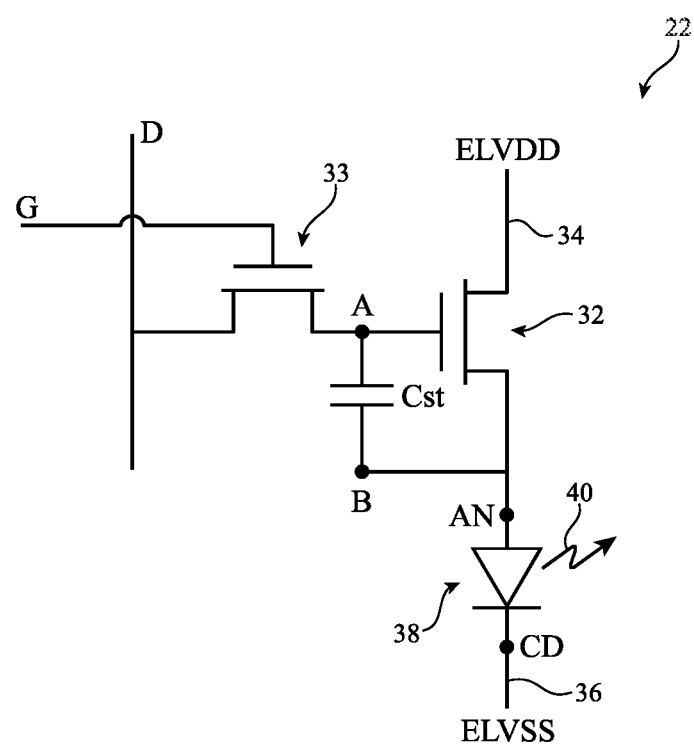
FIG. 3 is a diagram of an illustrative pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
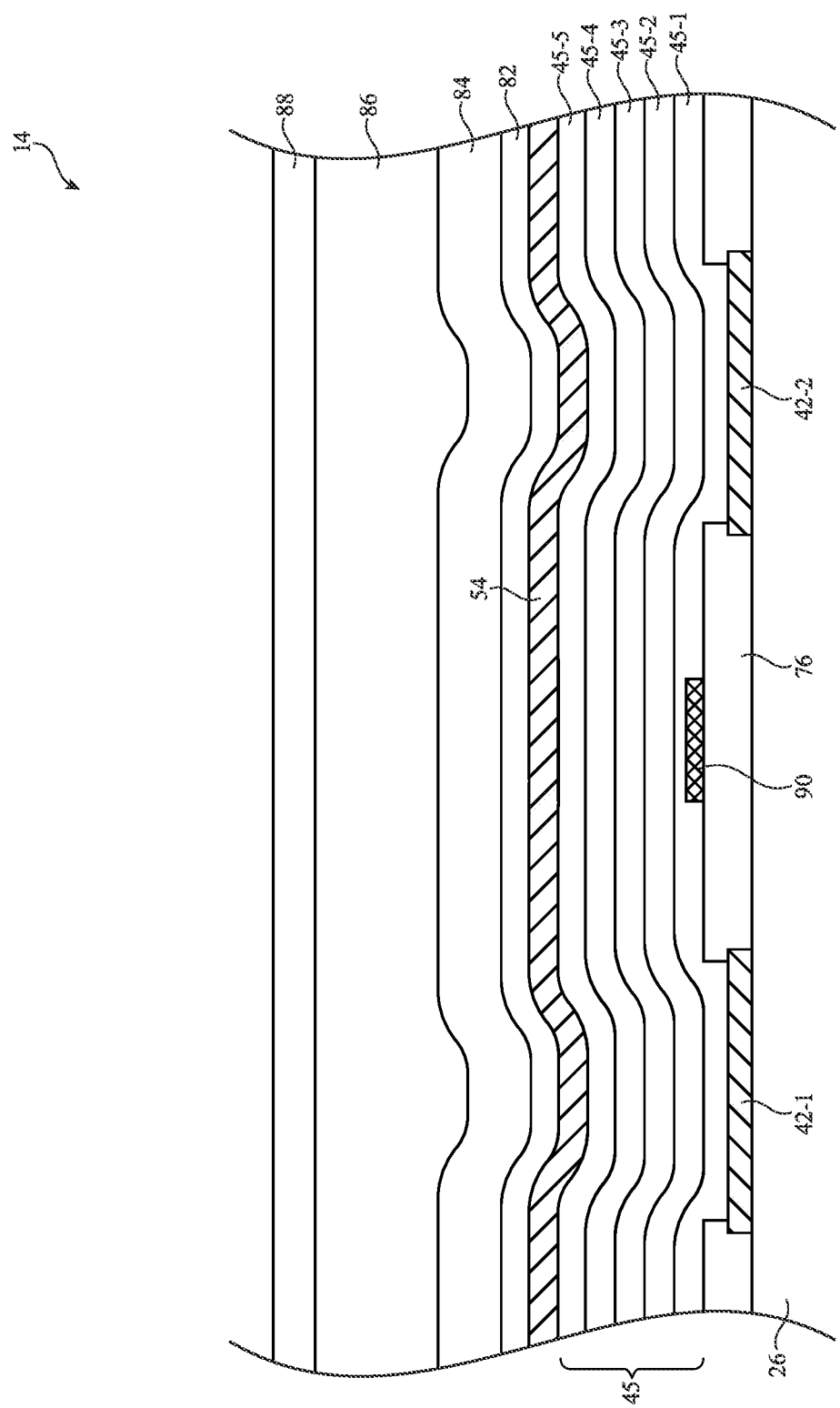
FIG. 4 is a cross-sectional side view of an illustrative organic light-emitting diode display in accordance with an embodiment.

FIG. 4 is a cross-sectional side view of an illustrative display with organic light-emitting diode display pixels. As shown, display 14 may include a substrate 26. Substrate 26 may be formed from one or more layers of glass, plastic, polymer, silicon, or any other desired material. Anodes such as anodes 42-1 and 42-2 may be formed on the substrate. Anodes 42-1 and 42-2 may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an emissive layer (EML), an electron—transport layer (ETL), an electronic-injection layer (EIL), and/or a charge generation layer (CGL), etc. Cathode 54 may be a conductive layer formed on the OLED layers 45. Cathode layer 54 may form a common cathode terminal (see, e.g., cathode terminal CD of FIG. 3) for all diodes in display 14. Cathode layer 54 may be formed from a transparent conductive material (e.g., indium tin oxide, a metal layer(s) that is sufficiently thin to be transparent, a combination of a thin metal and indium tin oxide, etc.). Each anode in display 14 may be independently controlled, so that each diode in display 14 can be independently controlled. This allows each pixel 22 to produce an independently controlled amount of light.

As shown in FIG. 4, OLED layers 45 (sometimes referred to as an organic stack-up, an organic stack, or an organic light-emitting diode stack) may include a plurality of organic light-emitting diode layers. FIG. 4 shows five illustrative organic light-emitting diode layers. Organic light-emitting diode layer 45-1 is formed over the anodes 42-1 and 42-2. The distance between adjacent anodes within the display (e.g., an edge-to-edge distance between anodes 42-1 and 42-2) may be less than 100 microns, less than 50 microns, less than 20 microns, less than 10 microns, less than 5 microns, less than 3 microns, less than 2 microns, less than 1 micron, between 1 micron and 5 microns, between 0.5 microns and 10 microns, greater than 0.5 microns, greater than 0.1 microns, etc. Organic light-emitting diode layer 45-2 is formed over organic light-emitting diode layer 45-1, organic light-emitting diode layer 45-3 is formed over organic light-emitting diode layer 45-2, organic light-emitting diode layer 45-4 is formed over organic light-emitting diode layer 45-3, organic light-emitting diode layer 45-5 is formed over organic light-emitting diode layer 45-4, and cathode layer 54 is formed over organic light-emitting diode layer 45-5. Each organic light-emitting diode layer may sometimes be referred to as a conductive organic light-emitting diode layer, a common organic light-emitting diode layer, a laterally conductive organic light-emitting diode layer, etc.

There are numerous possible arrangements for the organic light-emitting diode layers in display 14. In one illustrative embodiment, organic light-emitting diode layer 45-1 may be a hole injection layer, organic light-emitting diode layer 45-2 may be a hole transport layer, organic light-emitting diode layer 45-3 may be an emissive layer, organic light-emitting diode layer 45-4 may be an electron transport layer, and organic light-emitting diode layer 45-5 may be an electronic injection layer. In another illustrative arrangement, the organic light-emitting diode may be inverted such that the cathode is patterned per-pixel and the anode is a common layer. In this case, the organic light-emitting diode layer 45-1 may be an electron injection layer, organic light-emitting diode layer 45-2 may be an electronic transport layer, organic light-emitting diode layer 45-3 may be an emissive layer, organic light-emitting diode layer 45-4 may be a hole transport layer, and organic light-emitting diode layer 45-5 may be a hole injection layer.

The examples of layers included between the anodes 42 and the cathode 54 in FIG. 4 are merely illustrative. If desired, the layers may include an electron blocking layer, a charge generation layer, a hole blocking layer, etc. The hole injection layer and hole transport layer may collectively be referred to as a hole layer. The electron transport layer and the electron injection layer may collectively be referred to as an electron layer. In one illustrative arrangement, organic light-emitting diode layer 45-1 may be a hole layer, organic light-emitting diode layer 45-2 may be a first emissive layer, organic light-emitting diode layer 45-3 may be a charge generation layer (e.g., a layer that includes an n-doped layer and a p-doped layer for injection of electrons and holes in a tandem diode), organic light-emitting diode layer 45-4 may be a second emissive layer, and organic light-emitting diode layer 45-5 may be an electron layer.

In general, any desired layers may be included in between the anodes and the cathode and each layer in OLED layers 45 may be formed from any desired material. In some embodiments, the layers may be formed from organic material. However, in some cases one or more layers may be formed from inorganic material or a material doped with organic or inorganic dopants. The emissive layers may include organic electroluminescent material.

In subsequent embodiments, a patterned anode is depicted as being positioned below a common cathode layer. However, it should be understood that in each of these embodiments the anode and cathode may be inverted as previously described.

As shown in FIG. 4, display 14 may include a pixel definition layer (PDL) 76. The pixel definition layer may be formed from a dielectric material and may be interposed between adjacent anodes of the display. The pixel definition layer may have openings in which the anodes are formed, thereby defining the light-emitting area of each pixel. Each of the following embodiments of an organic light-emitting diode display may optionally include a pixel definition layer. In some cases, the pixel definition layer may be shaped in a way that reduces leakage between adjacent pixels.

Pixel definition layer 76 may include one or more layers and can either be opaque or transparent. The pixel definition layer may be formed from one or more materials (e.g., silicon nitride, silicon dioxide, etc.). The pixel definitional layer may also be formed from an organic material if desired. The shape of the pixel definitional layer may create discontinuities in the overlying organic light-emitting diode display layers if desired.

Additional layers may be formed over cathode layer 54 in display 14. As shown in FIG. 4, a capping layer 82 may be formed over cathode layer 54 in direct contact with cathode layer 54. Capping layer 82 may be formed from an organic material, as one example.

A first passivation layer 84 is formed over capping layer 82. Passivation layer 84 may form a moisture blocking layer that prevents moisture from penetrating to reach OLED layers 45. Passivation layer 84 may be formed from, for example, an inorganic material.

The surface topology of the OLED stack and processing restraints (to prevent damaging the OLED stack) may result in passivation layer 84 not forming a total moisture seal for OLED layers 45. Accordingly, a planarization layer 86 may be formed over passivation layer 84. Planarization layer 86 may be formed from an organic material that is deposited using inkjet printing. The planarization 86 may planarize the surface topology of the OLED layers, resulting in a planar upper surface for the planarization layer 86.

An additional passivation layer 88 is then formed over the planarization layer 86. The additional passivation layer 88 may form a final moisture-block that prevents any moisture from penetrating to reach OLED layers 45.

As shown in FIG. 4, a spacer 90 may be formed on the pixel definition layer between at least some of the adjacent anodes within display 14. Spacer 90 may be patterned in desired locations using photolithography. Spacers 90 may be distributed across the display to ensure proper spacing between the PDL and the overlying display layers.

Figure 5:
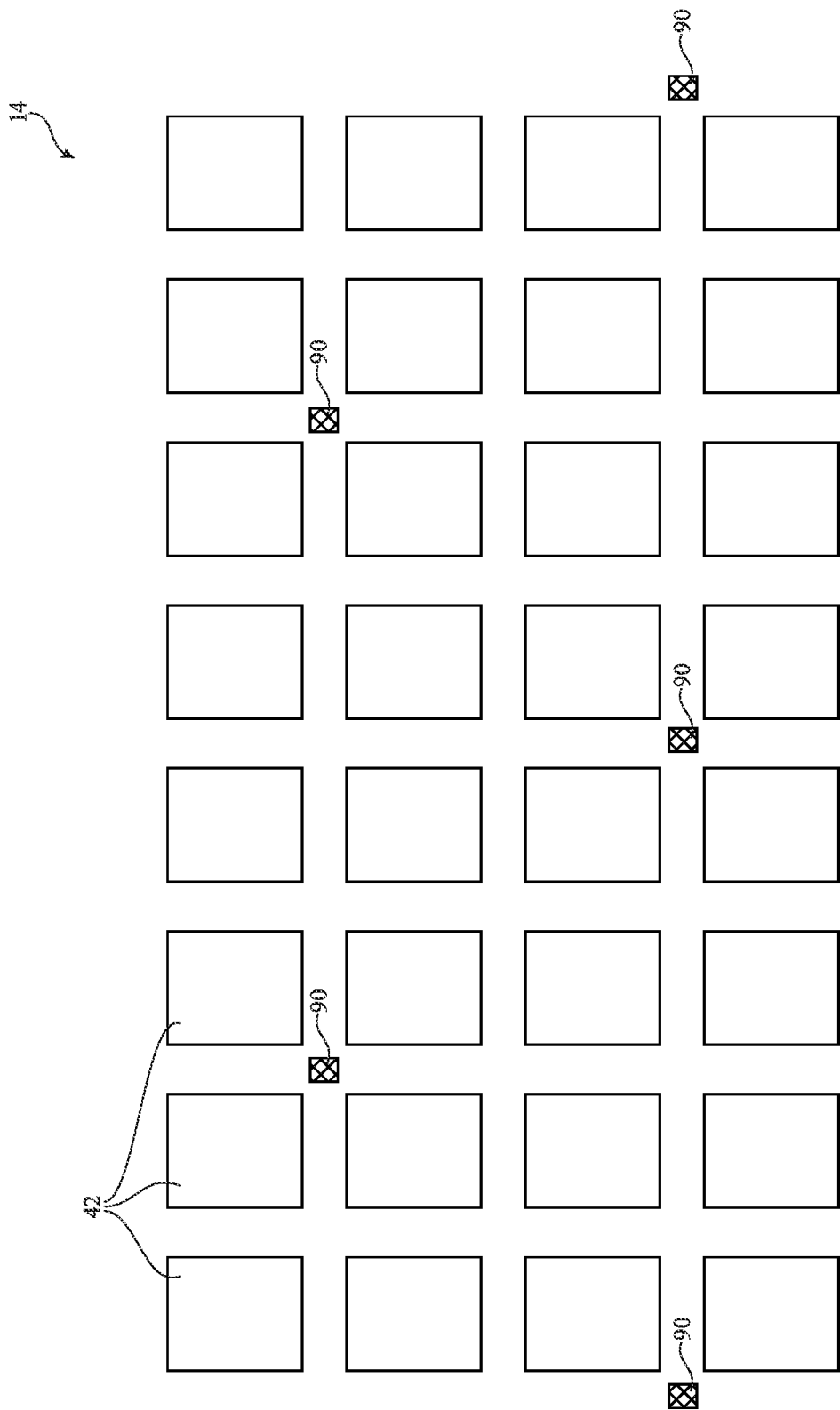
FIG. 5 is a top view of an illustrative organic light-emitting diode display with spacers in accordance with an embodiment.

FIG. 5 is a top view of an illustrative display showing how spacers may be distributed across the display. FIG. 5 shows an array of anodes arranged in a grid. A number of discrete spacers 90 (e.g., islands that are not connected to each other) are distributed across the grid of anodes. Each spacer 90 may be formed over the pixel definition layer (e.g., as shown in FIG. 4) between at least two adjacent anodes.

As shown in FIG. 5, the spacers need not be included between every adjacent pair of anodes in the display. The spacers may have a relatively low density. There may be four or more anodes for every 1 spacer in the pixel array, eight or more anodes for every 1 spacer in the pixel array, sixteen or more anodes for every 1 spacer in the pixel array, thirty-two or more anodes for every 1 spacer in the pixel array, between four and one hundred anodes for every 1 spacer in the pixel array, etc.

Each spacer 90 may have a thickness that is less than 20 microns, less than 15 microns, less than 10 microns, less than 5 microns, less than 3 microns, less than 2 microns, greater than 0.5 microns, greater than 1 micron, between 0.5 microns and 5 microns, between 1 micron and 2 microns, etc.

As previously mentioned, planarization layer 86 may be deposited using inkjet printing. The planarization layer 86 may therefore sometimes be referred to as inkjet-printed layer 86. In inkjet printing, the material for planarization layer 86 may be deposited as a liquid without needing a mask (e.g., the planarization layer is formed as a blanket layer over the pixel array). The deposited material may be cured to solidify and secure the planarization layer 86 in a desired location. Planarization layer 86 may be formed from an organic material or an epoxy if desired.

If care is not taken, forming planarization layer 86 up to but not over the edge of the substrate may be difficult. In some arrangements, dams may be included to prevent overflow of the planarization layer 86.

Figure 6:
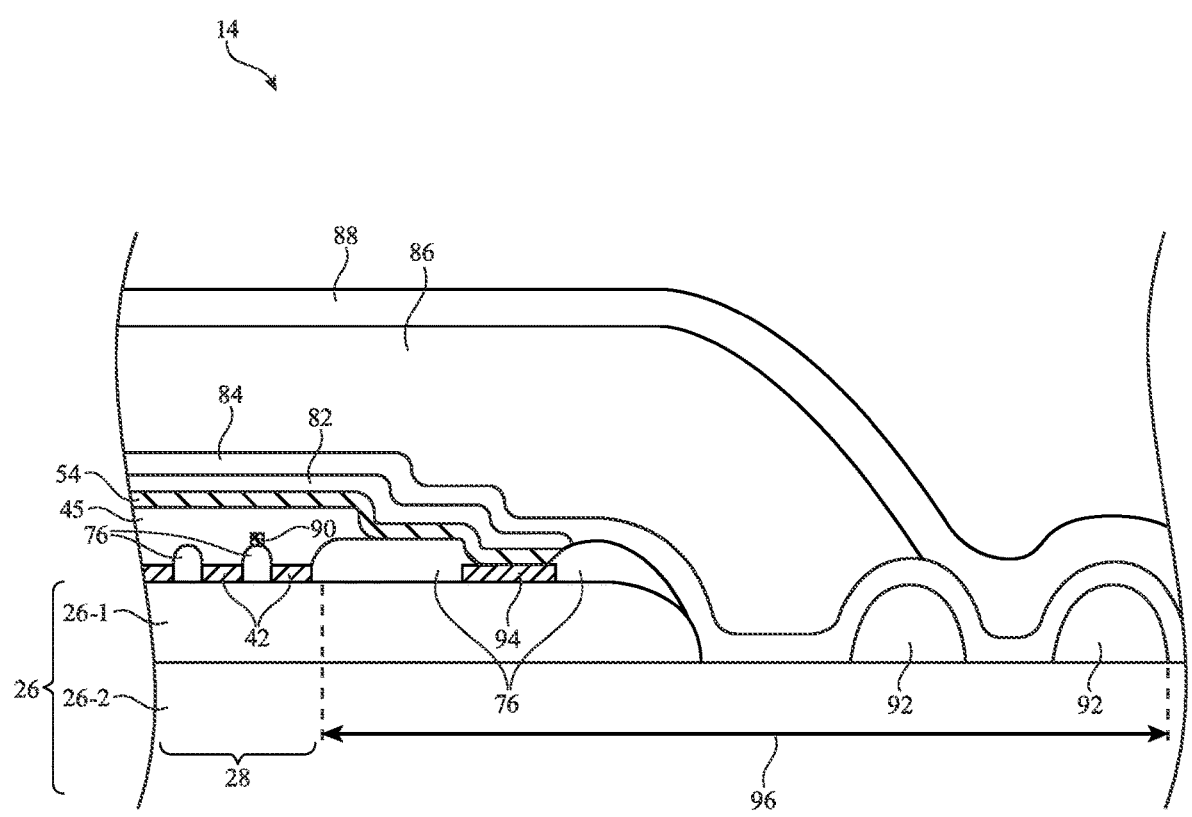
FIG. 6 is a cross-sectional side view of an illustrative organic light-emitting diode display with spacers in accordance with an embodiment.

FIG. 6 is a cross-sectional side view of display 14 showing how dam structures may be included to prevent overflow of planarization layer 86. As shown in FIG. 6, substrate 26 may include one or more substrate layers such as substrate layer 26-1 and substrate layer 26-2. Anodes 42 are formed on substrate layer 26-1. Pixel definition layer 76, spacers 90, OLED layers 45, and cathode layer 54 are formed over the anodes 42, as shown in connection with FIG. 4.

Anodes 42 are formed in pixel array 28 in a central portion of substrate 26, sometimes referred to as an active area or light-emitting active area. At the edge of substrate 26, a non-light emitting area or non-light-emitting inactive area with dam structures 92 is present. The inactive area may extend in a ring around the periphery of the active area.

Cathode layer 54 may extend out of the active area into the inactive area and electrically connect to a contact 94 that is exposed in an opening of a portion of pixel definition layer 76. Cathode layer 54 may be electrically connected to a power supply voltage (e.g., ELVSS in FIG. 2) via contact 94. Contact 94 is formed in the inactive area and may extend in a ring around the active area, may extend adjacent to one or more edges of the active area, etc.

Capping layer 82 may terminate over cathode layer 54, whereas passivation layer 84, planarization layer 86, and passivation layer 88 extend further towards the edge of the substrate. As shown in FIG. 6, passivation layer 84 may extend across the inactive area including over dam structures 92. Planarization layer 86 extends across the inactive area to dam structures 92. Dam structures 92 may prevent overflow of the planarization layer 86 past the dam structures during inkjet printing of the planarization layer. During manufacturing, the material for planarization layer 86 is deposited across the active area and in the inactive area of the display. The material may flow up to and contact the first dam structure 92. Some of the material may overflow the first dam structure 92, thus a second dam structure 92 is included to prevent the material for the planarization layer from overflowing the edge of the substrate. The second passivation layer 88 is formed over planarization layer 86 and extends across the inactive area including over dam structures 92.

Incorporating two dam structures 92 to ensure no overflow of the planarization layer 86 may result in a larger than desired distance 96 between the edge of the active area 28 and the edge of the dam structures. This, correspondingly, results in a larger than desired distance between the edge of the active area and the edge of the substrate 26 and a larger than desired total width of the inactive area.

Dam structures 92 may optionally be formed from the same material as layer 26-1 (e.g., portions of layer 26-1 may be patterned to form portions of dam structures 92) and/or layer 76 (e.g., portions of layer 76 may be patterned to form portions of dam structures 92).

To minimize the width of the inactive area, it may be desirable to omit one or both of dam structures 92. However, omitting dam structures 92 may be difficult without causing overflow or underfill of planarization layer 86. Overflow of planarization layer 86 occurs when the planarization layer spills over the substrate edge. To avoid overflow, the planarization layer may not be deposited as close to the edge of the substrate. However, this may result in underfill, where a portion of the substrate and/or pixel definition layer 76 that is intended to be covered by the planarization layer is not actually covered by the planarization layer (because the planarization layer does not extend close enough to the substrate edge).

Figure 7:
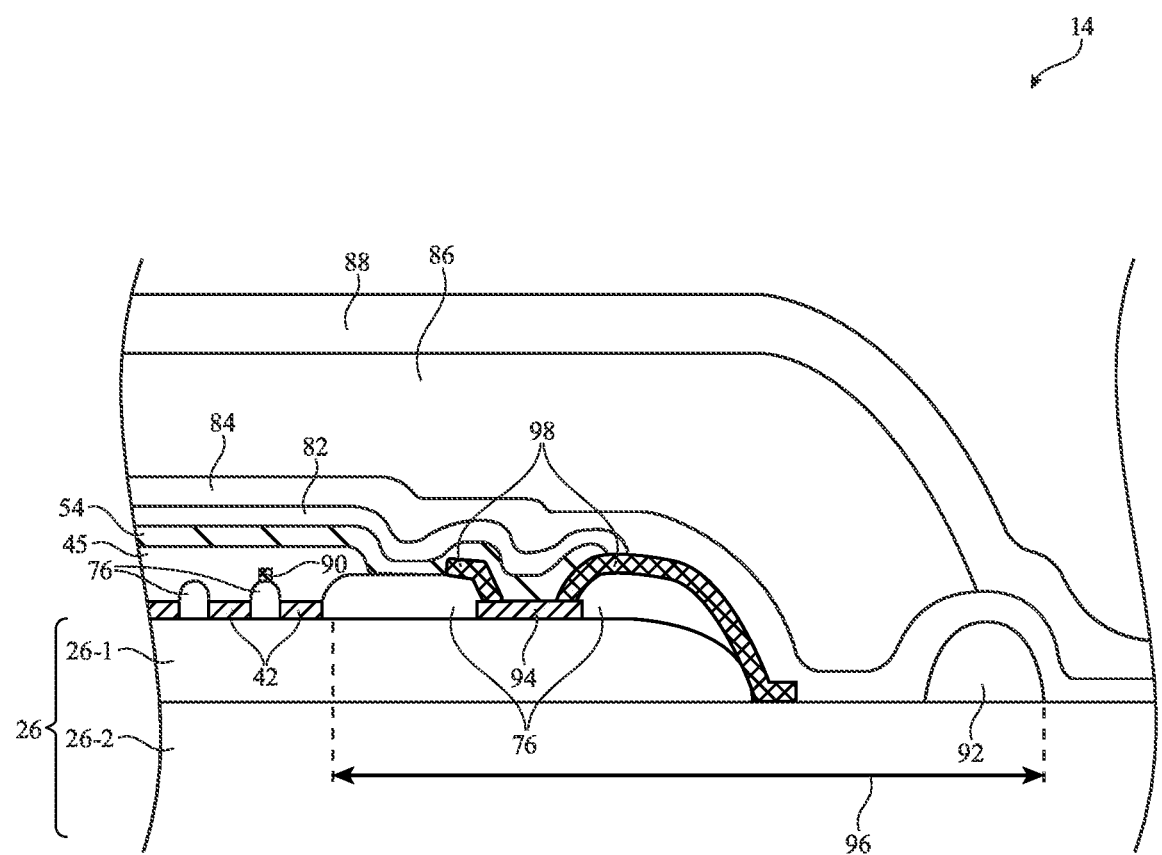
FIG. 7 is a cross-sectional side view of an illustrative organic light-emitting diode display with capillary-flow-inducing structures and one dam structure in accordance with an embodiment.

To remove one or both dam structures 92 without causing overfill or underfill of the planarization layer, capillary-flow-inducing structures may be incorporated into the display. FIG. 7 is a cross-sectional side view of an illustrative display with capillary-flow-inducing structures. As shown, capillary-flow-inducing structures 98 are incorporated over pixel definition layer 76. The capillary-flow-inducing structures 98 may be periodically spaced in a manner that induces capillary flow (where a liquid flows in narrow passageways without the assistance of gravity) in planarization layer 86 when the planarization layer is deposited using inkjet printing. In this manner, the planarization layer 86 may be deposited with enough gap from the substrate edge to avoid overflow. The capillary flow of the planarization layer 86 then ensures the planarization layer 86 flows to the desired edge without underfill. This allows for one of the dam structures 92 to be omitted in the display of FIG. 7 relative to the display of FIG. 6. This, correspondingly, results in distance 96 in FIG. 7 being lower than distance 96 in FIG. 6.

As shown in FIG. 7, the capillary-flow-inducing structures 98 are formed on pixel definition layer 76 (e.g., below cathode layer 54, capping layer 82, and passivation layer 84). However, the topology of the capillary-flow-inducing structures 98 is propagated up through the overlying layers such that the planarization layer 86 is deposited on a surface that has the same (or similar) topology as the capillary-flow-inducing structures. In other words, the upper surface of passivation layer 84 has an upper surface with topology that is caused by the capillary-flow-inducing structures. The planarization layer 86 then conforms to this topology and has capillary flow caused by the topology during inkjet printing.

It should be noted that the example of forming capillary-flow-inducing structures 98 on pixel definition layer 76 is merely illustrative. In general, the capillary-flow-inducing structures may be included at any desired location within the display stack-up below the planarization layer 86.

Capillary-flow-inducing structures 98 may be patterned from the same layer of material as spacers 90. Both capillary-flow-inducing structures 98 and spacers 90 are formed over pixel definition layer 76. A single material may therefore be patterned in a single manufacturing step to form capillary-flow-inducing structures 98 and spacers 90. This allows the capillary-flow-inducing structures 98 to be added to the display without adding an additional manufacturing step. The mask for forming spacers 90 can simply be adjusted to instead form both spacers 90 and capillary-flow-inducing structures 98.

Figure 8:
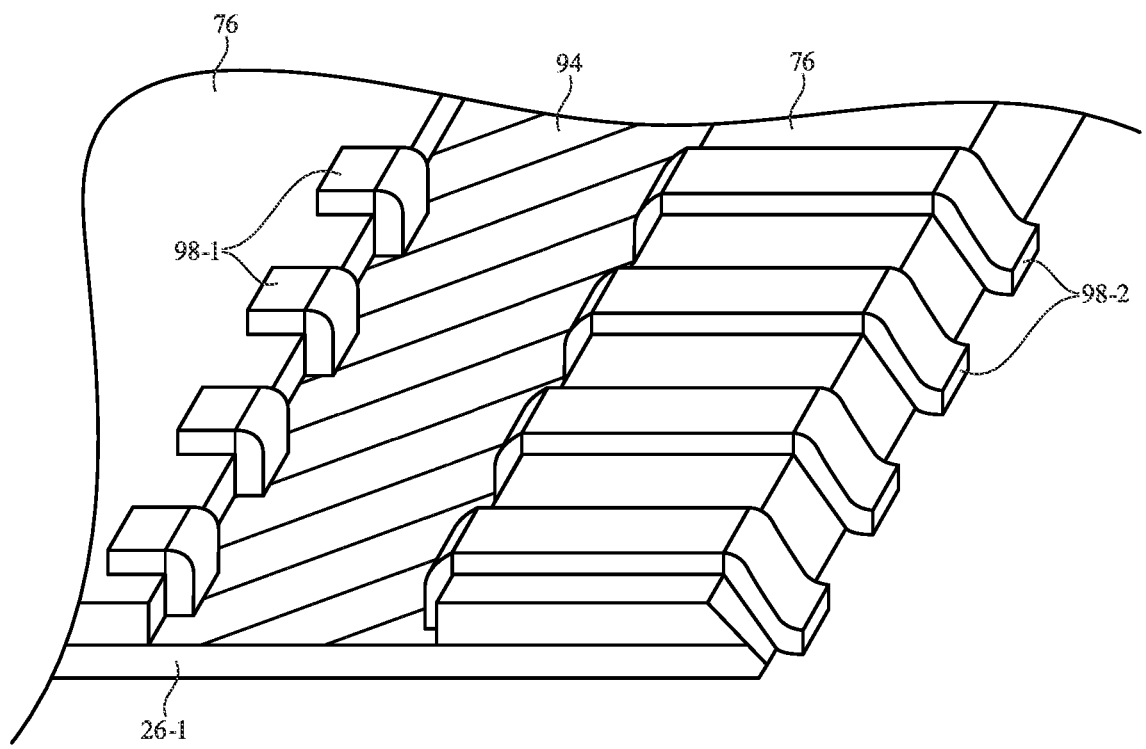
FIG. 8 is a perspective view of the illustrative capillary-flow-inducing structures of FIG. 7 in accordance with an embodiment.

FIG. 8 is a perspective view of display 14 with capillary-flow-inducing structures 98. As shown, a first set of structures 98-1 may be included over the edge of pixel definition layer 76 adjacent to the opening with exposed contact 94. These structures may ensure that overlying planarization layer 86 does not terminate at this edge of pixel definition layer 76 adjacent to contact 94. Instead, capillary flow cased by structures 98-1 ensure that the planarization layer 86 covers contact 94. Then, structures 98-2 cause capillary flow to ensure that the planarization layer 86 flows up to but not past the dam structure 92. Structures 98-2 partially overlap contact 94 (and a corresponding pixel definition layer edge). Structures 98-2 also overlap the outermost edge of substrate layer 26-1 and pixel definition layer 76 (as is also shown in FIG. 7). A central portion of contact 94 is not overlapped by any capillary-flow-inducing structures.

Figure 9:
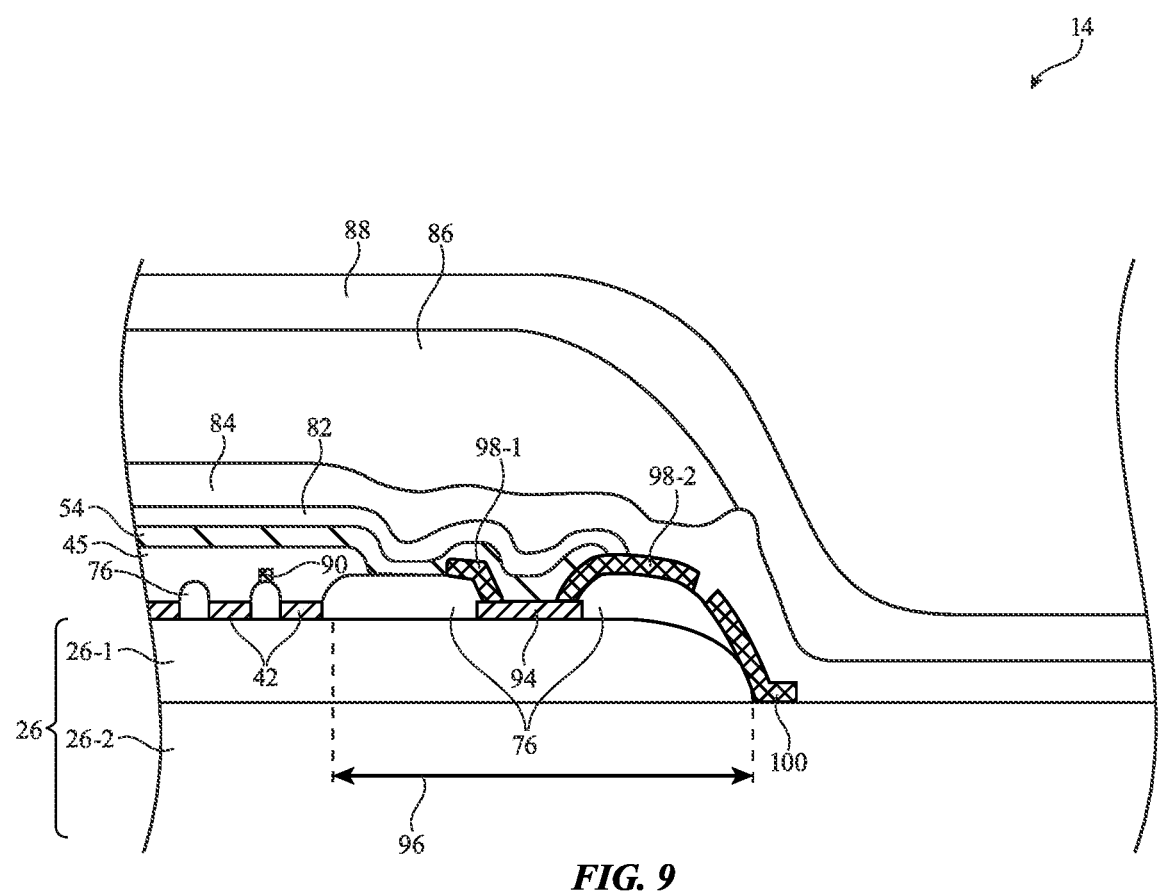
FIG. 9 is a cross-sectional side view of an illustrative organic light-emitting diode display with capillary-flow-inducing structures, an edge guide, and no dam structures in accordance with an embodiment.

FIG. 9 is a cross-sectional side view of an illustrative display with capillary-flow-inducing structures and no separate dam structures. As shown, capillary-flow-inducing structures 98 are incorporated over pixel definition layer 76. The capillary-flow-inducing structures 98 may be periodically spaced in a manner that induces capillary flow in planarization layer 86 when the planarization layer is deposited using inkjet printing. In this manner, the planarization layer 86 may be formed with enough gap from the substrate edge to avoid overflow. The capillary flow of the planarization layer 86 then ensures the planarization layer 86 flows to the desired edge without underfill. This allows for both of the dam structures 92 to be omitted in the display of FIG. 9 relative to the display of FIG. 6. This may result in distance 96 in FIG. 9 being lower than distance 96 in FIG. 6.

Similar to as shown in FIG. 8, the display in FIG. 9 includes first and second sets of capillary-flow-inducing structures 98. The first capillary-flow-inducing structures 98-1 are spaced periodically on a first side of contact 94 (closer to active area 28). The second capillary-flow-inducing structures 98-2 are spaced periodically on a second side of contact 94 (further from active area 28). However, structures 98-2 in FIG. 9 do not extend past the edge of substrate 26-1 (as in FIG. 7).

When no dam structures are included, the display may optionally include an edge guide 100. Edge guide 100 may be formed from the same material (e.g., the same patterned layer) as spacers 90 and capillary-flow-inducing structures 98-1 and 98-2.

Figure 10:
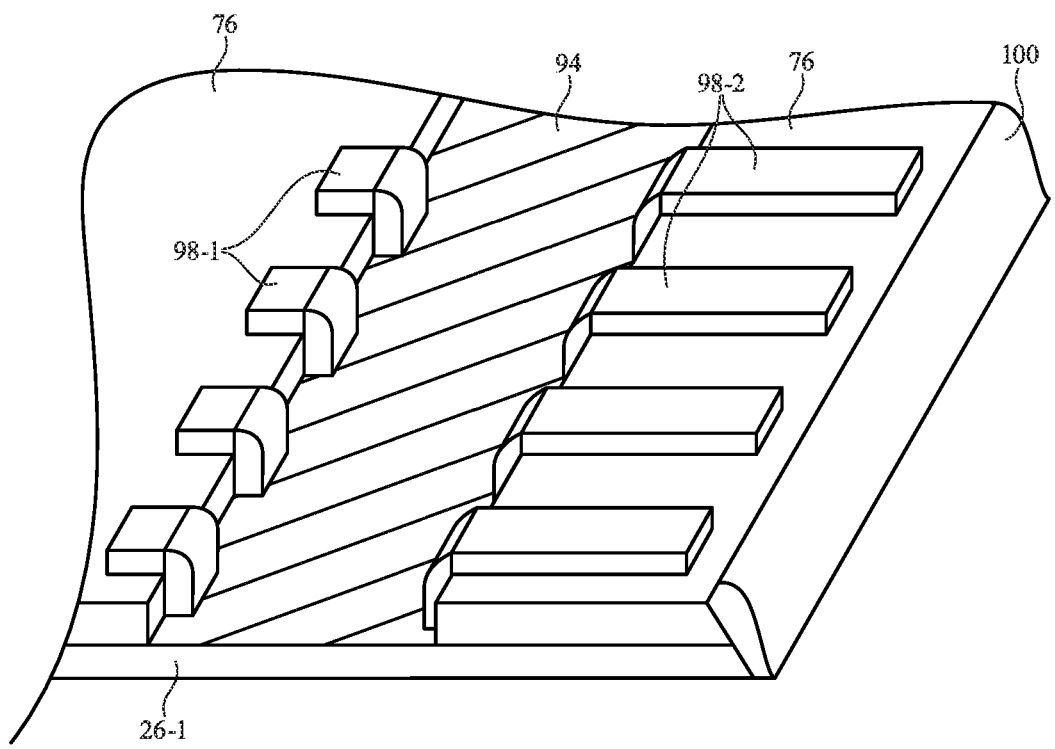
FIG. 10 is a perspective view of the illustrative capillary-flow-inducing structures and edge guide of FIG. 9 in accordance with an embodiment.

As shown in the perspective view of FIG. 10, edge guide 100 extends continuously along the edge of substrate 26-1 (e.g., parallel to the edge of the active area). Edge guide 100 does not have the same periodic gaps as structures 98-1 and 98-2. In this way, edge guide 100 does not promote capillary flow but instead serves as a barrier to prevent overflow of the planarization layer 86. Edge guide 100 may be omitted if desired.

Figure 11A:
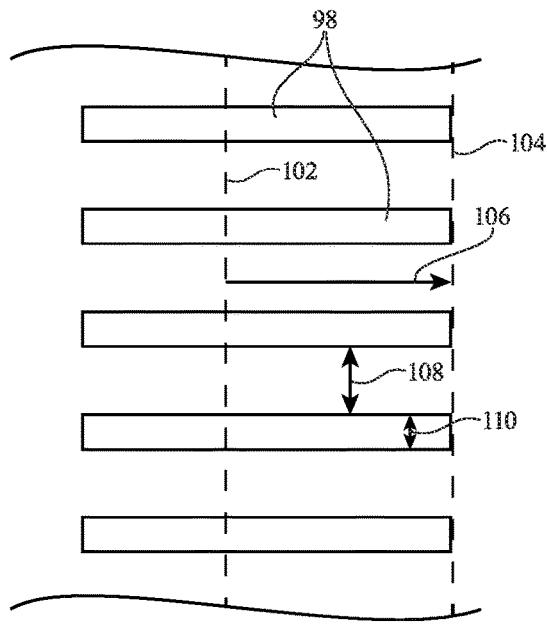
FIGS. 11A-11C are top views of illustrative capillary-flow-inducing structures in accordance with an embodiment.

There are many possible layouts for the capillary-flow-inducing structures in the display. FIGS. 8 and 10 show examples where the capillary-flow-inducing structures are rectangular strips. FIG. 11A is a top view of capillary-flow-inducing structures of this type. The planarization layer may be inkjet printed to the left of border 102 up to the border 102. The planarization layer therefore partially overlaps the rectangular capillary-flow-inducing structures 98 when initially deposited. Capillary flow induced by structures 98 causes the deposited material to flow in direction 106 to the end of the capillary-flow-inducing structures at border 104.

The capillary-flow-inducing structures may have any desired dimensions. As shown in FIG. 11A, the capillary-flow-inducing structures have a width 110 and a spacing 108. Width 110 may be greater than 3 microns, greater than 5 microns, greater than 10 microns, greater than 20 microns, greater than 30 microns, greater than 50 microns, greater than 100 microns, less than 100 microns, less than 50 microns, between 5 microns and 50 microns, etc. Spacing 108 may be greater than 3 microns, greater than 5 microns, greater than 10 microns, greater than 20 microns, greater than 30 microns, greater than 50 microns, greater than 100 microns, greater than 150 microns, greater than 200 microns, greater than 300 microns, less than 500 microns, less than 200 microns, less than 100 microns, less than 50 microns, between 5 microns and 250 microns, etc.

Figure 11B:
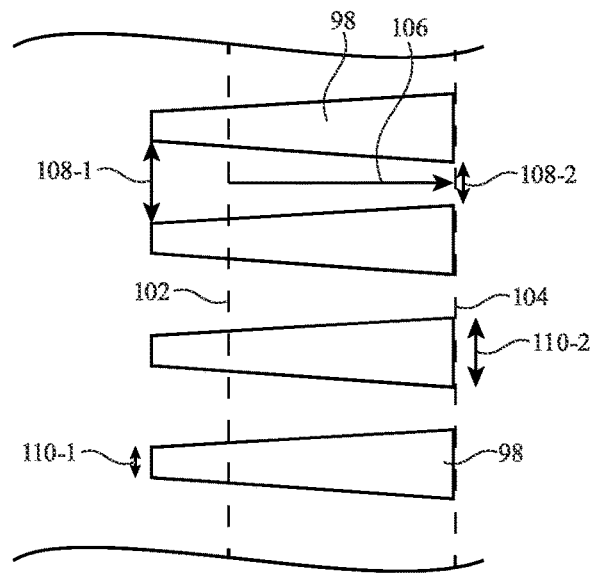

FIG. 11B is a top view of capillary-flow-inducing structures formed from tapered strips. The planarization layer may be inkjet printed to the left of border 102 up to the border 102. The planarization therefore partially overlaps the tapered capillary-flow-inducing structures 98 when deposited. Capillary flow induced by the structures 98 causes the deposited material to flow in direction 106 to the end of the capillary-flow-inducing structures at border 104.

The tapered capillary-flow-inducing structures in FIG. 11B have a first end with a first width 110-1 and a second end with a second width 110-2. There is a corresponding spacing 108-1 between the capillary-flow-inducing structures at the first end and a spacing 108-2 between the capillary-flow-inducing structures at the second end. The tapered capillary-flow-inducing structures have a trapezoidal shape (sometimes referred to as a tapered rectangular shape). Each one of widths 110-1 and 110-2 may have any desired magnitude (e.g., greater than 3 microns, greater than 5 microns, greater than 10 microns, greater than 20 microns, greater than 30 microns, greater than 50 microns, greater than 100 microns, less than 100 microns, less than 50 microns, between 5 microns and 50 microns, etc.). Each one of spacings 108-1 and 108-2 may have any desired magnitudes (greater than 3 microns, greater than 5 microns, greater than 10 microns, greater than 20 microns, greater than 30 microns, greater than 50 microns, greater than 100 microns, greater than 150 microns, greater than 200 microns, greater than 300 microns, less than 500 microns, less than 200 microns, less than 100 microns, less than 50 microns, between 5 microns and 250 microns, etc.). The difference between widths 110-1 and 110-2 (which is equal to the difference between spacings 108-1 and 108-2) may be greater than 3 microns, greater than 5 microns, greater than 10 microns, greater than 20 microns, greater than 30 microns, greater than 50 microns, greater than 100 microns, less than 100 microns, less than 50 microns, between 5 microns and 50 microns, etc.

Figure 11C:
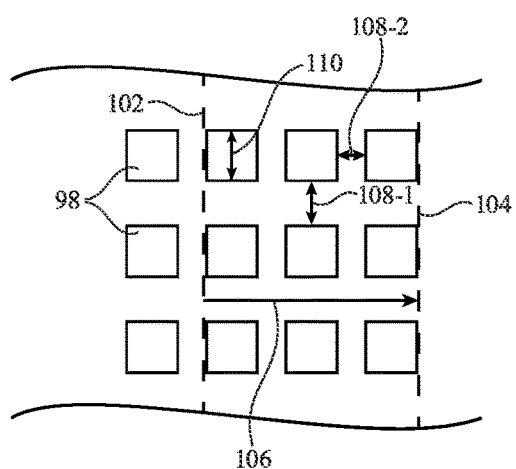

FIG. 11C is a top view of capillary-flow-inducing structures formed from dots (sometimes referred to as dot structures). The planarization layer may be inkjet printed to the left of border 102 up to the border 102. The planarization therefore partially overlaps the capillary-flow-inducing structures 98 when deposited. Capillary flow induced by the structures 98 causes the deposited material to flow in direction 106 to the end of the capillary-flow-inducing structures at border 104.

Each dot structure may be a square (or rectangle) or circle (or oval) having a width 110 and spacing 108. There may be first spacing 108-1 in a first direction and second spacing 108-2 in a second direction orthogonal to the first direction. The spacing 108-1 and 108-2 may optionally be the same. Width 110 may have any desired magnitude (e.g., greater than 3 microns, greater than 5 microns, greater than 10 microns, greater than 20 microns, greater than 30 microns, greater than 50 microns, greater than 100 microns, less than 100 microns, less than 50 microns, between 5 microns and 50 microns, etc.). Each one of spacings 108-1 and 108-2 may have any desired magnitudes (greater than 3 microns, greater than 5 microns, greater than 10 microns, greater than 20 microns, greater than 30 microns, greater than 50 microns, greater than 100 microns, greater than 150 microns, greater than 200 microns, greater than 300 microns, less than 500 microns, less than 200 microns, less than 100 microns, less than 50 microns, between 5 microns and 250 microns, etc.).

The aforementioned examples of shapes for the capillary-flow-inducing structures are merely illustrative. In general, the capillary-flow-inducing structures may have any desired shapes, dimensions, and layouts. The capillary-flow-inducing structures of FIGS. 11A-11C have uniform shapes and layouts as pictured. However, if desired the shape and/or spacing of the capillary-flow-inducing structures may vary across the inactive area of the display.

Figure 12A:
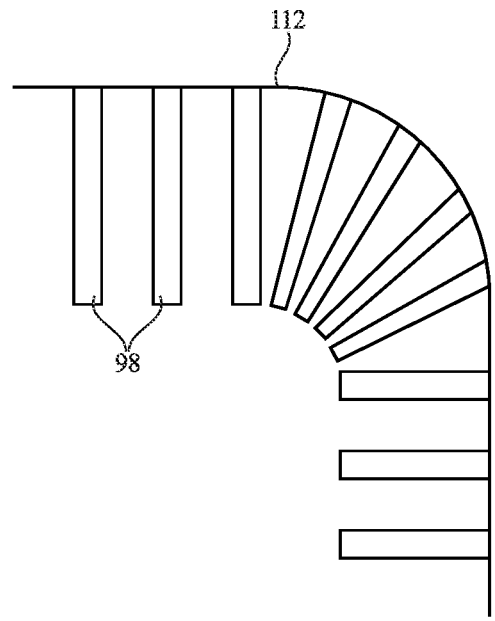
FIG. 12A is a top view of an illustrative electronic device with capillary-flow-inducing structures in a rounded corner in accordance with an embodiment.

The capillary-flow-inducing structures 98 may be used to form a display corner having a desired shape. In some cases, the active area of the display has a rounded corner. The inactive area and corresponding substrate edge may therefore also have rounded corners. Capillary-flow-inducing structures 98 may be included to ensure that planarization layer 86 has the target rounded corner shape in all four corners of the display. As shown in FIG. 12A, capillary-flow-inducing structures 98 are arranged to define a rounded corner 112. As shown in FIG. 12A, some of the capillary-flow-inducing structures (at the edges of the display between the rounded corners) are formed by rectangular strips (as in FIG. 11A). The capillary-flow-inducing structures in the rounded corner area are formed from tapered strips (as in FIG. 11B). This type of arrangement ensures planarization layer 86 has a rounded corner shape.

Figure 12B:
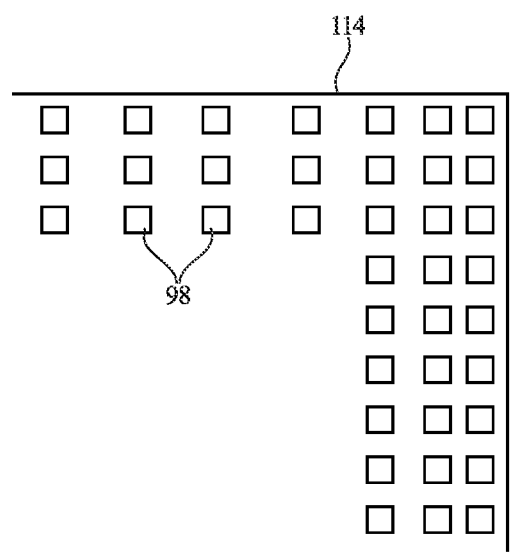
FIG. 12B is a top view of an illustrative electronic device with capillary-flow-inducing structures in a right-angled corner in accordance with an embodiment.

In another possible arrangement, the active area of the display has a right-angled corner. The inactive area and corresponding substrate edge may therefore also have right-angled corners. Capillary-flow-inducing structures 98 may be included to ensure that planarization layer 86 has the target right-angled corner shape in all four corners of the display. As shown in FIG. 12B, capillary-flow-inducing structures 98 are arranged to define a rounded corner 114. The capillary-flow-inducing structures of FIG. 12B are formed from dots (as in FIG. 11C). This type of arrangement ensures planarization layer 86 has a right-angled corner.

Figure 13A:
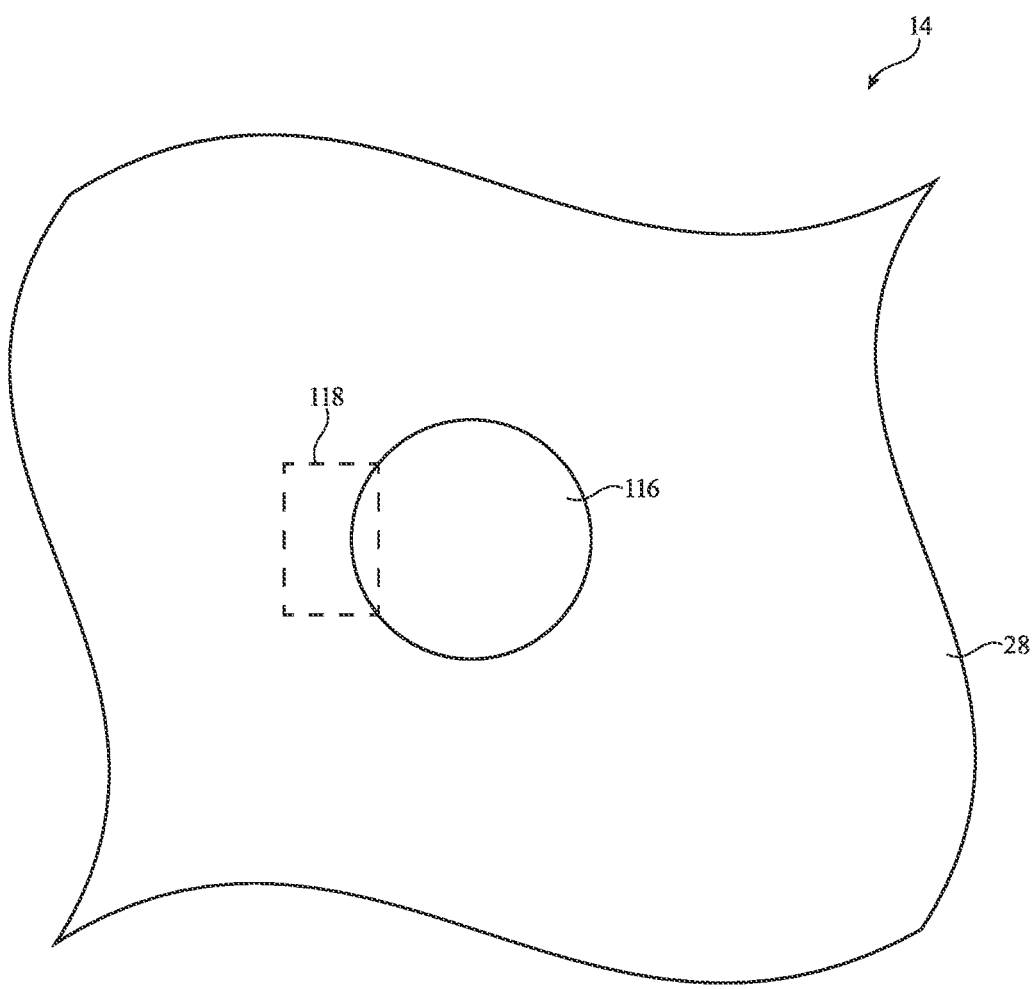
FIG. 13A is a top view of an illustrative display with an inactive area island in accordance with an embodiment.

In the aforementioned examples, arrangements have been described where capillary-flow-inducing structures are used to control the footprint of planarization layer 86 around the periphery of the display. However, in some cases the active area may have an opening in a central portion of the display. As shown in the example of FIG. 13A, inactive area 116 (sometimes referred to as active area opening, display opening 116, inactive area island 116, etc.) is formed within active area 28 and is completely laterally surrounded by active area 28. Inactive area 116 may be, for example, a physical hole in the display that allows for input-output components to operate through the display (through the physical hole). Capillary-flow-inducing structures may be used to control the footprint of planarization layer 86 at the border between the active area and inactive area island 116.

Figure 13B:
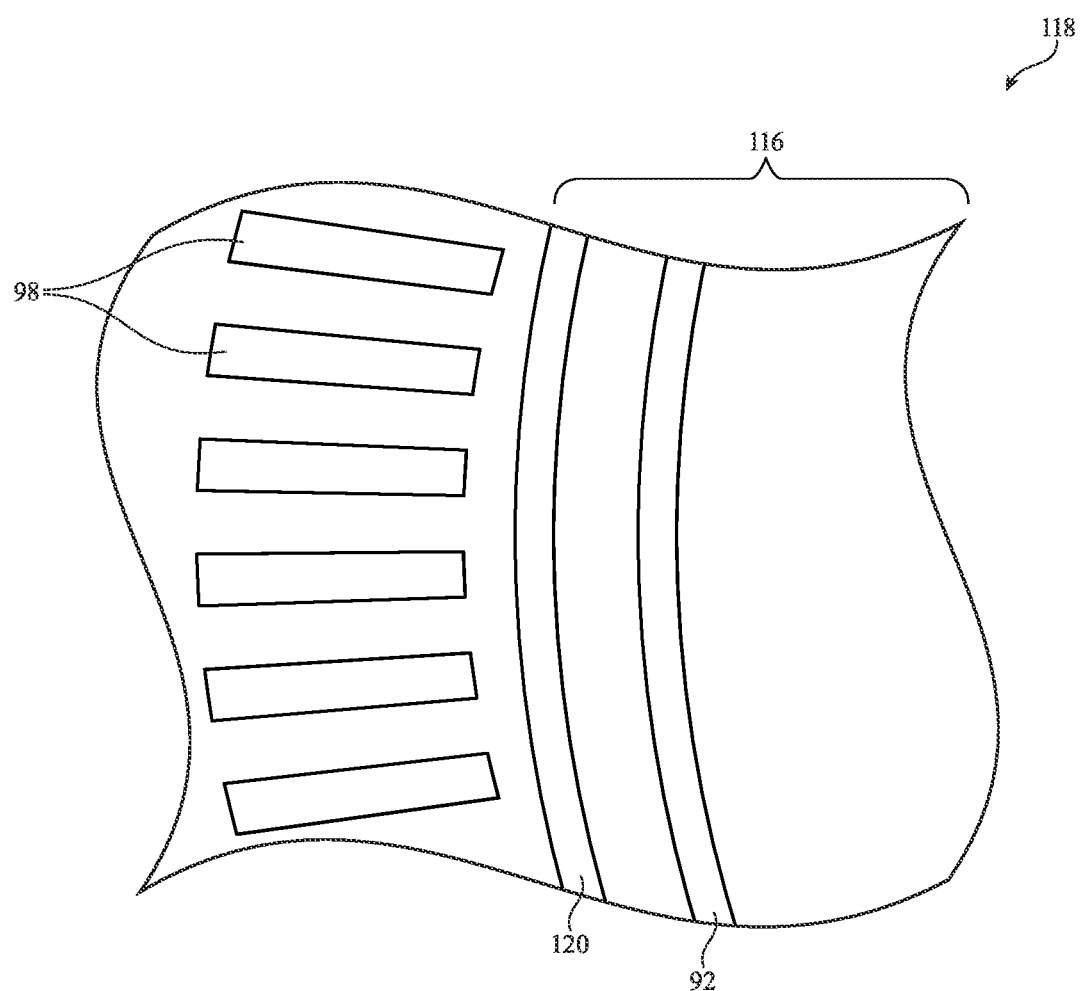
FIG. 13B is a top view of the illustrative display of FIG. 13A showing capillary-flow-inducing structures adjacent to the inactive area island in accordance with an embodiment.

FIG. 13B is a top view of inset portion 118 of FIG. 13A. As shown, capillary-flow-inducing structures 98 may be included that ensure the planarization layer overlaps an evaporative deposition separator 120. Evaporative deposition separator 120 (sometimes referred to as a cutting structure) is used as a physical barrier to prevent display layers from the active area from being formed in inactive area 116. It may be desirable for planarization layer 86 to overlap evaporative deposition separator 120 to ensure a moisture-tight seal of the layers in the active area. Accordingly, capillary-flow-inducing structures 98 are included adjacent to evaporative deposition separator 120 to cause capillary flow of the planarization layer 86 at least over the evaporative deposition separator 120. A single dam structure 92 may be included to block overflow of the planarization layer 86 into the remaining, central portion of inactive area 116. Without capillary-flow-inducing structures 98, two dam structures may be required in the inactive area 116 to mitigate overflow of the planarization layer 86. Including the capillary-flow-inducing structures 98 therefore reduces the required size of the border of the inactive area (similar to as described in connection with FIGS. 6 and 7). Moreover, dam structure 92 in FIG. 13B may be omitted (e.g., no dam structure is included) if desired. In this case, the capillary-flow-inducing structures 98 may have an arrangement similar to as in FIGS. 9 and 10 (with an optional edge guide).

Thus far, the capillary-flow-inducing structures 98 described have induced capillary flow in planarization layer 86 in inactive areas of the display (e.g., in portions of the display that do not overlap the light-emitting active area). However, in another possible embodiment, spacers 90 may be arranged to induce capillary flow in the active area of the display.

Figure 14:
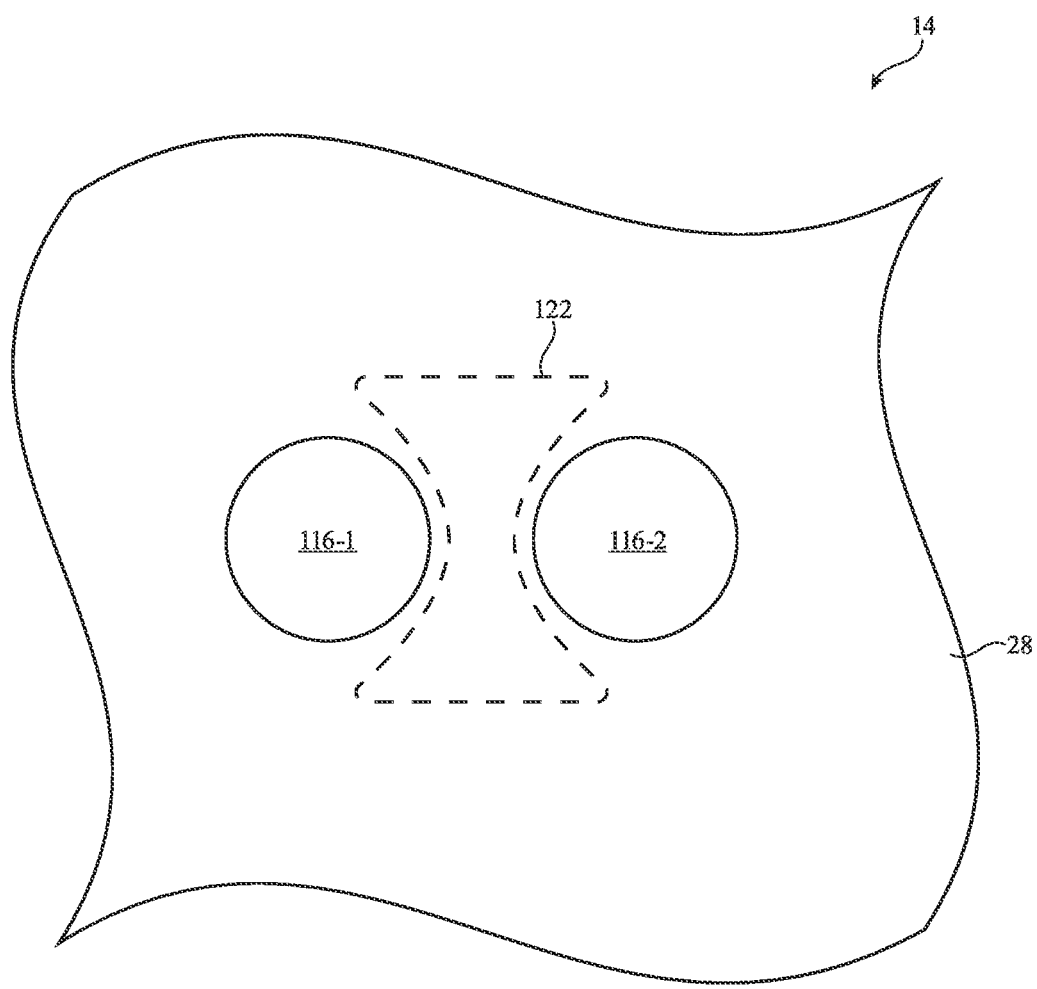
FIG. 14 is a top view of an illustrative display with different display regions having different spacer densities in accordance with an embodiment.

FIG. 14 is a top view of an illustrative display with two inactive area islands 116 that are laterally surrounded by active area 28. The small width of the portion of the active area between inactive areas 116-1 and 116-2 may result in the planarization layer having a raised portion (hill) between the inactive areas. To better control the profile of the planarization layer and ensure a planar upper surface, spacers 90 may have a high density (and therefore small spacing) in region 122 between inactive areas 116-1 and 116-2. In this region, the high density of spacers 90 induces capillary flow in the planarization layer and ensures that the planarization layer has a desired surface profile.

Figure 15:
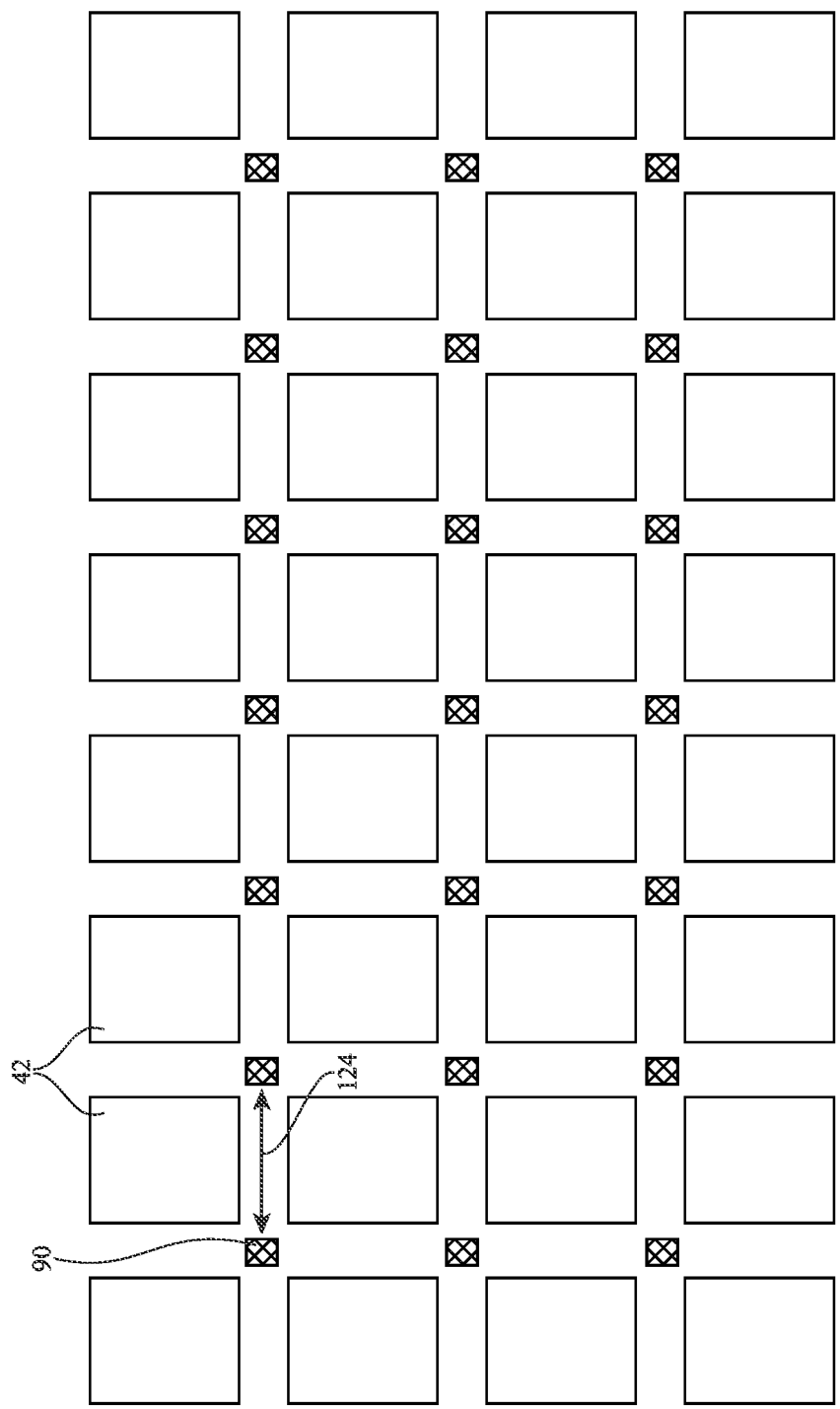
FIG. 15 is a top view of an illustrative display region with a high spacer density in accordance with an embodiment.

FIG. 15 is a top view of a display region such as region 122 in FIG. 14 that has a high spacer density. As shown, one spacer may be included for each anode in the display. The distance 124 between each spacer and its closest adjacent spacer may be less than 150 microns, less than 100 microns, less than 75 microns, less than 50 microns, less than 30 microns, etc.

In FIG. 14, region 122 may have the high spacer density of FIG. 15 and the remaining portion of the active area may have the lower spacer density of FIG. 5. In other words, the spacer density is higher in a portion of active area 28 between inactive areas 116 than in the remaining portions of the active area. The spacer density (e.g., number of spacers per unit area or number of spacers per anode) in region 122 may be higher than the spacer density in the remaining active area by more than 50%, more than 100%, more than 150%, more than 200%, more than 500%, more than 1000%, etc. The spacers in region 122 may have the same dimensions as the spacers in the remaining portion of the active aera or may have different dimensions than the spacers in the remaining portion of the active area.

In other possible arrangement, the entire active area 28 may have a high spacer density as shown in FIG. 15 (regardless of whether inactive area islands are present in the active area). Forming the spacers with a high density in the active area may prevent ink voids where the planarization layer does not fill a desired area (leaving a void). Across the entire active area, distance 124 between each spacer and its closest adjacent spacer may be less than 150 microns, less than 100 microns, less than 75 microns, less than 50 microns, less than 30 microns, etc. There may be one spacer for every three or less anodes across the active area, one spacer for every two or less anodes across the active area, or one spacer for every anode across the active area.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   a substrate;
   an array of display pixels arranged on the substrate in a light-emitting first area, wherein a periphery of the first area is adjacent to a non-light-emitting second area;
   a plurality of capillary-flow-inducing structures that are formed over the substrate in the second area, wherein the plurality of capillary-flow-inducing structures comprises a plurality of periodically spaced rectangular strips;
   a first passivation layer that is formed over the array of display pixels and the plurality of capillary-flow-inducing structures;
   a planarization layer that is formed over the first passivation layer; and
   a second passivation layer that is formed over the planarization layer.

2. The electronic device defined in claim 1, wherein the rectangular strips extend away from the first area.

3. The electronic device defined in claim 1, wherein the planarization layer is an inkjet-printed layer and wherein the capillary-flow-inducing structures induce capillary flow in the planarization layer during inkjet printing.

4. The electronic device defined in claim 1, further comprising:
   a pixel definition layer having first portions interposed between display pixels in the array of display pixels and having second portions in the second area.

5. The electronic device defined in claim 4, wherein the plurality of capillary-flow-inducing structures is formed on the second portions of the pixel definition layer.

6. The electronic device defined in claim 5, further comprising:
   spacers that are formed on the first portions of the pixel definition layer, wherein the spacers are formed from a material and wherein the plurality of capillary-flow-inducing structures is also formed from the material.

7. The electronic device defined in claim 6, wherein the array of display pixels comprises a cathode layer, wherein a contact on the substrate is exposed in an opening in the second portions of the pixel definition layer, wherein the cathode layer is electrically connected to the contact, wherein the contact has first and second opposing sides, wherein the first side is closer to the first area than the second side, wherein first capillary-flow-inducing structures are formed on the first side of the contact, and wherein second capillary-flow-inducing structures are formed on the second side of the contact.

8. The electronic device defined in claim 7, wherein no capillary-flow-inducing structures are formed over a central portion of the contact.

9. The electronic device defined in claim 8, further comprising:
an edge guide that is formed on the second portions of the pixel definition layer, wherein the second capillary-flow-inducing structures are interposed between the first capillary-flow-inducing structures and the edge guide and wherein the edge guide is also formed from the material.

10. The electronic device defined in claim 9, wherein the edge guide extends continuously in a direction that is parallel to an edge of the first area.

11. The electronic device defined in claim 5, further comprising:
spacers that are formed on the first portions of the pixel definition layer, wherein a higher number of spacers per unit area is included in a first region of the first area than in a second region of the first area.

12. The electronic device defined in claim 11, wherein the first region is interposed between first and second portions of the non-light-emitting second area.

13. An electronic device comprising:
a substrate;
an array of display pixels arranged on the substrate in a light-emitting first area, wherein a periphery of the first area is adjacent to a non-light-emitting second area;
a pixel definition layer having first portions interposed between display pixels in the array of display pixels and having second portions in the second area;
a plurality of capillary-flow-inducing structures that are formed on the second portions of the pixel definition layer;
a first passivation layer that is formed over the array of display pixels and the plurality of capillary-flow-inducing structures;
a planarization layer that is formed over the first passivation layer; and
a second passivation layer that is formed over the planarization layer.

14. The electronic device defined in claim 13, wherein the plurality of capillary-flow-inducing structures comprises a plurality of periodically spaced trapezoidal strips.

15. The electronic device defined in claim 13, wherein the plurality of capillary-flow-inducing structures comprises a plurality of dot structures.

* * * * *